US010416561B2

(12) United States Patent
Yamasaki et al.

(10) Patent No.: US 10,416,561 B2
(45) Date of Patent: Sep. 17, 2019

(54) COATING COMPOSITION, AND PROCESS FOR PRODUCING PHOTORESIST LAMINATE

(71) Applicant: Asahi Glass Company, Limited, Chiyoda-ku (JP)

(72) Inventors: Ryujiro Yamasaki, Chiyoda-ku (JP); Masahiro Ito, Chiyoda-ku (JP); Yoshihiko Sakane, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 245 days.

(21) Appl. No.: 15/454,021

(22) Filed: Mar. 9, 2017

(65) Prior Publication Data
US 2017/0307975 A1  Oct. 26, 2017

(30) Foreign Application Priority Data

Apr. 22, 2016 (JP) ................. 2016-086162

(51) Int. Cl.
| *C09D 129/10* | (2006.01) |
| *C09D 5/00* | (2006.01) |
| *C09D 127/12* | (2006.01) |
| *B05D 1/00* | (2006.01) |
| *B05D 3/02* | (2006.01) |
| *B05D 5/06* | (2006.01) |
| *B05D 7/24* | (2006.01) |
| *G03F 7/09* | (2006.01) |
| *G03F 7/11* | (2006.01) |
| *G03F 7/16* | (2006.01) |
| *C09K 13/08* | (2006.01) |
| *H01L 21/027* | (2006.01) |
| *G03F 7/004* | (2006.01) |
| *C08F 116/14* | (2006.01) |
| *C09D 4/06* | (2006.01) |
| *C08F 8/12* | (2006.01) |

(52) U.S. Cl.
CPC ............. *G03F 7/091* (2013.01); *B05D 1/005* (2013.01); *B05D 3/0272* (2013.01); *C08F 8/12* (2013.01); *C08F 116/14* (2013.01); *C09D 4/06* (2013.01); *C09D 5/006* (2013.01); *C09D 127/12* (2013.01); *C09D 129/10* (2013.01); *G03F 7/0046* (2013.01); *G03F 7/162* (2013.01); *G03F 7/168* (2013.01)

(58) Field of Classification Search
CPC ...... G03F 7/091; G03F 7/0046; G03F 7/0048; C09D 4/06; C09D 5/006; C09D 127/12; C09D 129/10; C08F 14/18; C08F 14/185; C08F 114/18; C08F 114/185; C08F 214/18; C08F 214/182; C08F 214/184; C08F 16/14; C08F 116/14; C08F 216/14; C08L 29/10; C08L 27/12
See application file for complete search history.

(56) References Cited

U.S. PATENT DOCUMENTS

| 7,964,659 B2 | 6/2011 | Otozawa | |
| 2010/0286318 A1* | 11/2010 | Akiyama | ................ G03F 7/091 |
| | | | 524/247 |

FOREIGN PATENT DOCUMENTS

| JP | 11-124531 A | 5/1999 |
| JP | 3965740 B2 | 8/2007 |
| JP | 2008-242303 A | 10/2008 |
| JP | 2010235667 A * | 10/2010 |
| JP | 4910829 B2 | 4/2012 |

OTHER PUBLICATIONS

Machine translation of JP 2010-235667 A.*

* cited by examiner

Primary Examiner — Kregg T Brooks
(74) Attorney, Agent, or Firm — Oblon, McClelland, Maier & Neustadt, L.L.P.

(57) ABSTRACT

A coating composition which contains a fluorinated polymer having a unit (1) represented by —[$CX^1X^2$—$CY^1(Rf^1$—$COOM^1)$]— and a fluorinated compound represented by $CX^3X^4$=$CY^2(Rf^2$—$COOM^2)$, wherein the content of the fluorinated compound is from 0.1 to 8.0 parts by mass per 100 parts by mass of the fluorinated polymer. $X^1$, $X^2$, $X^3$ and $X^4$ are H, F or Cl, $Y^1$ and $Y^2$ are H, F, Cl, a methyl group or a trifluoromethyl group, $Rf^1$ and $Rf^2$ are a perfluoroalkylene group which may contain an etheric oxygen atom between carbon-carbon atoms, or an oxyperfluoroalkylene group which may contain an etheric oxygen atom between carbon-carbon atoms, —$COOM^1$ is —COOH or —$COOZ^1$, and —$COOM^2$ is —COOH or —$COOZ^2$ (wherein $Z^1$ and $Z^2$ are an ammonium ion in which the hydrogen atom may be substituted). The coating composition is suitable for forming a thin antireflection coating layer without increasing its refractive index.

11 Claims, No Drawings

COATING COMPOSITION, AND PROCESS FOR PRODUCING PHOTORESIST LAMINATE

TECHNICAL FIELD

The present invention relates to a coating composition. Particularly, it relates to a coating composition useful as a composition for forming antireflection coating layer in photolithography, and a process for producing a photoresist laminate by using it.

BACKGROUND ART

Photolithography techniques are used in processes for producing semiconductors, etc., and for example, a process for producing semiconductor circuits includes steps of forming patterns of resist (resist pattern).

When the resist layer formed on a substrate is irradiated with exposure light, in addition to the light incident on the resist layer, the light reflected from the substrate surface, and the light which is generated from such a reflected light reflected from the surface of the resist layer again will interfere each other. As a result, standing waves are generated. Such standing waves may cause dimensional changes and collapses of the shape of the resist pattern, etc.

Further, there may be the case that fine resist patterns are to be formed on the surface having differences in level. In such a case, the dimensional changes and collapses of the shape due to the standing waves (standing wave effect) tend to be large.

Heretofore, as methods for suppressing the standing wave effect, a method of incorporating a light absorbing agent in the resist material, a method of providing an antireflection coating layer on the top surface of resist layer (TARC method), a method of providing an antireflection coating layer on the lower surface of resist layer (BARC method), etc. have been proposed.

The TARC method is a method of providing, on the resist layer, an antireflection coating layer having a lower refractive index than the resist layer, whereby the lower the refractive index of the antireflection coating layer is, the higher the obtainable antireflection effect is.

Patent Document 1 discloses, as the antireflection coating composition to be used in the TARC method, a composition having a polymer having $-(CF_2-CFOCF_2CF_2COOH)-$ units dissolved in a mixed solvent which consists of water and methanol.

In general, it is known that the ideal refractive index of the antireflection coating layer is the square root ($\sqrt{n}$) of the refractive index n of the photoresist layer for obtaining excellent antireflection effect in the TARC method, and the ideal coating layer thickness is odd number of multiple of $\lambda/4m$ ($\lambda$ is the wavelength of radial rays, and m is the refractive index of the antireflection coating layer) (Patent Document 2, paragraph.

PRIOR ART DOCUMENTS

Patent Documents

Patent Document 1: Japanese Patent No. 3965740
Patent Document 2: Japanese Patent No. 4910829

DISCLOSURE OF INVENTION

Technical Problem

In recent years, along with higher integration and operating speed in LSI, miniaturization of semiconductor circuits is required. To meet this, shortening of the wavelength of exposure light source used in forming resist patterns is in progress.

For example, in a mass production process for 64 M bits DRAM (dynamic random access memory), KrF excimer laser (248 nm) was used as the exposure light source, but shorter wavelength ArF excimer laser (193 nm) or $F_2$ laser (157 nm) is used for the production of the DRAM having 256 M bits and more than 1 G bits.

Along with such shortening of the wavelength of exposure light source, the ideal coating layer thickness tends to be thin, and a technique to make the antireflection coating layer thinner than the previous one is required. As a method for controlling the coating layer thickness of the antireflection coating layer, for example, a method of adjusting the viscosity of the coating composition by additives has been known.

The present inventors have added a fluorinated surfactant to the antireflection coating composition in Patent Document 1 and found that the refractive index of the coating layer increased.

It is an object of the present invention to provide a coating composition which can form a thin antireflection coating layer without increasing its refractive index, and a process for producing a photoresist laminate using it.

Solution to Problem

The present invention provides a coating composition and a process for producing a photoresist laminate using it, having the following constructions [1] to [13]. [1] A coating composition which comprises a fluorinated polymer having a unit represented by the following formula (1) and a fluorinated compound represented by the following formula (2), wherein the content of the fluorinated compound is from 0.1 to 8.0 parts by mass per 100 parts by mass of the fluorinated polymer:

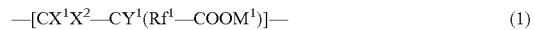

$$-[CX^1X^2-CY^1(Rf^1-COOM^1)]- \quad (1)$$

wherein $X^1$ and $X^2$ are each independently a hydrogen atom, a fluorine atom or a chlorine atom, $Y^1$ is a hydrogen atom, a fluorine atom, a chlorine atom, a methyl group or a trifluoromethyl group, $Rf^1$ is a perfluoroalkylene group which may contain an etheric oxygen atom between carbon-carbon atoms, or an oxyperfluoroalkylene group which may contain an etheric oxygen atom between carbon-carbon atoms, the number of carbon atoms in $Rf^1$ is from 1 to 10 or in the case that $Rf^1$ contains the etheric oxygen atom, from 2 to 10, and $-COOM^1$ is $-COOH$ or $-COOZ^1$ (wherein $Z^1$ is an ammonium ion in which the hydrogen atom may be substituted);

$$CX^3X^4=CY^2(Rf^2-COOM^2) \quad (2)$$

wherein $X^3$ and $X^4$ are each independently a hydrogen atom, a fluorine atom or a chlorine atom, $Y^2$ is a hydrogen atom, a fluorine atom, a chlorine atom, a methyl group or a trifluoromethyl group, $Rf^2$ is a perfluoroalkylene group which may contain an etheric oxygen atom between carbon-carbon atoms, or an oxyperfluoroalkylene group which may contain an etheric oxygen atom between carbon-carbon atoms, the number of carbon atoms in $Rf^2$ is from 1 to 10 or in the case that $Rf^2$ contains the etheric oxygen atom, from 2 to 10, and $-COOM^2$ is $-COOH$ or $-COOZ^2$ (wherein $Z^2$ is an ammonium ion in which the hydrogen atom may be substituted).

[2] The coating composition according to [1], wherein all of $X^1$, $X^2$ and $Y^1$ are fluorine atoms.

[3] The coating composition according to [1] or [2], wherein the fluorinated polymer has number average molecular weight of from 1,000 to 30,000.

[4] The coating composition according to any one of [1] to [3], wherein the content of the fluorinated polymer in the coating composition is from 1 to 25 mass %.

[5] The coating composition according to any one of [1] to [4], wherein $CX^1X^2$ in the fluorinated polymer is equal to $CX^3X^4$ in the fluorinated compound.

[6] The coating composition according to any one of [1] to [5], wherein $CY^1$ in the fluorinated polymer is equal to $CY^2$ in the fluorinated compound.

[7] The coating composition according to any one of [1] to [6], wherein $COOM^1$ in the fluorinated polymer is equal to $COOM^2$ in the fluorinated compound.

[8] The coating composition according to any one of [1] to [7], wherein $Rf^1$ in the fluorinated polymer is equal to $Rf^2$ in the fluorinated compound.

[9] The coating composition according to any one of [1] to [8], which further contains a solvent.

[10] The coating composition according to any one of [1] to [8], which further contains a polymer different from the above mentioned fluorinated polymer, and wherein the content of the different polymer in the coating composition is from 1 to 50 mass % based on the total amount of the fluorinated polymer and the polymer different from the above mentioned fluorinated polymer.

[11] The coating composition according to [10], which further contains a solvent.

[12] A process for producing a photoresist laminate having an antireflection coating layer provided on the surface of a photoresist layer, which comprises applying a coating liquid which contains the coating composition defined in any one of [1] to [9] and in which the content of the fluorinated polymer is from 1 to 10 mass %, to the surface of the photoresist layer, and drying to form the antireflection coating layer.

[13] A process for producing a photoresist laminate having an antireflection coating layer provided on the surface of a photoresist layer, which comprises applying a coating liquid which contains the coating composition defined in [10] or [11] and in which the total content of the fluorinated polymer and the polymer different from the above fluorinated polymer is from 1 to 10 mass %, to the surface of the photoresist layer, and drying to form the antireflection coating layer.

Advantegous Effects of Invention

According to the coating composition of the present invention, it is possible to make the antireflection coating layer thin without increasing its refractive index.

According to the process for producing a photoresist laminate of the present invention, it is possible to make the antireflection coating layer formed on the surface of the photoresist layer thin without increasing its refractive index.

DESCRIPTION OF EMBODIMENTS

The coating composition of the present invention comprises a fluorinated polymer (hereinafter sometimes referred to as "fluorinated polymer (A)" having a unit represented by the above formula (1) (hereinafter sometimes referred to as "unit (1)") and a fluorinated compound (hereinafter sometimes referred to as "fluorinated compound (B)") represented by the above formula (2).

[Fluorinated Polymer (A)]

The fluorinated polymer (A) may have another unit (hereinafter sometimes referred to as "unit (2)") not having —$COOM^1$ (wherein $M^1$ is as defined for $M^1$ in the formula (1)).

In the formula (1), $X^1$ and $X^2$ are each independently a hydrogen atom, a fluorine atom or a chlorine atom. In view of availability of the material, a hydrogen atom or a fluorine atom is preferred. They are preferably fluorine atoms from such a viewpoint that the content of fluorine atom in the fluorinated polymer (A) tends to be sufficiently high and the refractive index in the short wavelength region of an antireflection coating layer prepared by using the fluorinated polymer (A) tends to be low.

$Y^1$ is a hydrogen atom, a fluorine atom, a chlorine atom, a methyl group or a trifluoromethyl group. In view of availability of the material, a fluorine atom is preferred.

Rf is a perfluoroalkylene group or an oxyperfluoroalkylene group. The perfluoroalkylene group or the oxyperfluoroalkylene group may contain an etheric oxygen atom between carbon-carbon atoms.

The perfluoroalkylene group means a group in which all of hydrogen atoms bonded to carbon atoms of the alkylene group are substituted by fluorine atoms. The perfluoroalkylene group may be linear or branched.

The oxyperfluoroalkylene group means that the perfluoroalkylene groups are bonded via ether bonds (—O—) to the carbon atom to which $Y^1$ is boned in the formula (1). The oxyperfluoroalkylene group may be linear or branched.

The term "containing an etheric oxygen atom between carbon-carbon atoms" means that an oxygen atom of the ether bond is inserted in the carbon chain (between carbon-carbon atoms) constituting the perfluoroalkylene group or the oxyperfluoroalkylene group.

The number of carbon atoms in $Rf^1$ is from 1 to 10, preferably from 1 to 6, particularly preferably from 3 to 6. In the case that $Rf^1$ has the etheric oxygen atom between carbon-carbon atoms, the number of carbon atoms in $Rf^1$ is from 2 to 10, preferably from 2 to 6, particularly preferably from 3 to 6. When the number of carbon atoms is at least the lower limit value in the above range, the fluorine atom content in the fluorinated polymer (A) becomes sufficiently high, therefore the refractive index in the short wavelength region of the antireflection coating layer prepared by using the fluorinated polymer (A) becomes low. When it is at most the upper limit value in the above range, the fluorinated polymer (A) has excellent solubility in water.

In the formula (1), —$COOM^1$ is —COOH or —$COOZ^1$ (wherein $Z^1$ is an ammonium ion in which the hydrogen atom may be substituted).

$Z^1$ is $NH_4^+$ or an ammonium group having a hydrogen atom, at least, of $NH_4^+$ substituted by an alkyl group. The alkyl group is preferably a $C_{1-6}$ alkyl group. $Z^1$ is preferably —$NR^1R^2R^3R^{4+}$ (wherein $R^1$ to $R^4$ are each independently a hydrogen atom or a $C_{1-3}$ alkyl group), particularly preferably $NH_4^+$ in the view of the applicability and low Cost.

As preferred examples of the unit (1), the following units (a1) to (a6) may be mentioned.

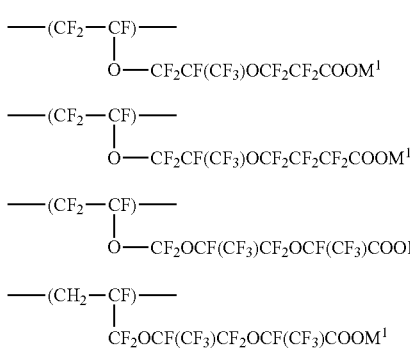

For example, the unit (2) may, be a unit based on a polymerizable perfluoro compound such as a fluoroethylene such as $CF_2=CF_2$, $CH_2=CF_2$ or $CF_2=CFCl$, a perfluorovinyl ether or a perfluoroolefin having at least 3 carbon atoms.

Based on all the units constituting the fluorinated polymer (A), the proportion of the unit (1) is preferably at least 50 mol %, more preferably at least 70 mol %, particularly preferably 100 mol %. When the proportion of the unit (1) is at least the lower limit value in the above range, the fluorinated polymer (A) has excellent solubility in aqueous alkali solution.

The number average molecular weight of the fluorinated polymer (A) is preferably from 1,000 to 30,000, more preferably from 1,500 to 5,000, particularly preferably from 2,500 to 3,500.

When the number average molecular weight is at least the above lower limit value, the coating layer-forming property becomes excellent, therefore uniformity in the coating layer thickness at the flat surface becomes excellent. When it is at most the above upper limit value, the followability to the difference in level becomes excellent in application process, and in the case that there are irregularities on the surface of the resist layer, the coating amount required to cover the entire surface of the convexes and concaves may be a little, and the solubility in aqueous alkaline solution becomes excellent.

The method for producing the fluorinated polymer (A) wherein $—COOM^1$ is —COOH is not particularly limited, but the following method (i) or method (ii) is preferred. (i) A method of polymerizing monomers having a precursor functional group convertible to "COOH" to obtain a polymer precursor, and then converting the precursor functional group to "—COOH". (ii) A method of polymerizing fluorinated monomers not having a precursor functional group, and then introducing "—COOH" to a part of polymer.

As the method (i), a method may be mentioned wherein a fluorinated monomer represented by $CX^1X^2=CY^1$ ($Rf^1$—$COOCH_3$) (wherein $X^1$, $X^2$, $Y^1$ and $Rf^1$ are the same as in the formula (1)) (hereinafter sometimes referred to as "fluorinated monomer (1))" is polymerized to obtain the polymer precursor, and then, the $—COOCH_3$ part is hydrolyzed.

The polymerization method is not particularly limited, and known methods may be utilized. Preferred is a polymerization method that fluorinated monomer (1) is heated after adding a polymerization initiator to fluorinated monomer (1). In the polymerization reaction, a chain transfer agent may be used.

In the polymerization reaction, a liquid medium may be used, or not be used. In the case that it is used, it is preferred that the polymerization reaction is carried out in the state that the monomer used for the polymerization reaction is dissolved or dispersed in the liquid medium. The liquid medium may be preferably water or a fluorinated solvent.

The method of hydrolyzing the $—COOCH_3$ part in the polymer precursor to obtain the fluorinated polymer (A), is not particularly limited. For example, a method of stirring a solution including the precursor polymer mixed in water or a solvent containing water, may be mentioned. It is preferred to stir the solution while heating. At that time, the temperature of the solution is preferably from 50 to 150° C.

The organic solvent to be used by mixing with water for the hydrolysis is preferably an alcohol from the viewpoint of excellent solubility in water, and a fluorinated alcohol is particularly preferred among alcohols from the viewpoint of excellent solubility with the polymer precursor. The fluorinated alcohol is preferably a compound having the content of fluorine atoms of at least 50 wt %. For example, 2-(perfluorobutyl)ethanol, 2-(perfluorohexyl)ethanol, hexafluoroisopropanol or 2,2,3,3-tetrafluoropropanol may be mentioned. The mass ratio of water to the organic solvent in the mixed solvent is preferably from 3:7 to 9:1, particularly preferably from 4:6 to 6:4. When it is in the above range, both water and the precursor polymer are readily soluble.

As an example of the method (ii), a method may be mentioned that sulfuric acid and water are added to convert $—CCl_3$ to COOH after the fluorinated monomer represented by $CX^1X^2=CY^1$ ($Rf^1$—$CCl_3$) is polymerized.

As a method for producing the fluorinated polymer (A) wherein $—COOM^1$ is $—COOZ^1$, a method may be mentioned that the polymer having —COOH is obtained by method (i) or (ii), and then an organic amine is added to covert —COOH to $—COOZ^1$. The organic amine may be a monoalkylamine such as ethylamine or propylamine, a dialkylamine such as diethylamine, a trialkylamine such as triethylamine, or an alkanolamine such as ethanolamine or diethanolamine. Such a kind of organic amine may be used alone or in combination of two or more.

[Fluorinated Compound (B)]

In formula (2), $X^3$ and $X^4$ are the same as $X^1$ and $X^2$ in the formula (1) including the preferred embodiments.

$Y^2$ is the same as $Y^1$ in the formula (1) including the preferred embodiments.

$Rf^2$ is the perfluoroalkylene group or the oxyperfluoroalkylene group the same as for $Rf^1$ in the formula (1). The number of carbon atoms in $Rf^2$ is from 1 to 10, preferably from 1 to 6, particularly preferably from 3 to 6. In the case that $Rf^2$ has an etheric oxygen atom between carbon-carbon atoms, the number of carbon atoms in $Rf^2$ is from 2 to 10, preferably from 2 to 6, particularly preferably from 3 to 6. When the number of carbon atoms is at least the lower limit value in the above range, the content of fluorine atoms in the fluorinated compound (B) becomes sufficiently high, therefore it is possible to suppress the refractive index increase of the antireflection coating layer by containing the fluorinated compound (B). When it is at most the upper limit value in the above range, the solubility of the fluorinated compound (B) in water becomes excellent.

$—COOM^2$ is the same as $—COOM^1$ in the formula (1) including the preferred embodiments. $Z^2$ in $—COOM^2$ is also the same as $Z^1$ in the formula (1) including the preferred embodiments.

[Coating Composition]

The coating composition of the present invention (hereinafter sometimes referred to as "composition") comprises the fluorinated polymer (A) and the fluorinated compound (B). Two or more than two types of the fluorinated compound (B) may be contained.

$CX^1X^2$ in the fluorinated polymer (A) and $CX^3X^4$ in the fluorinated compound (B) in the composition may be the same (including steric isomerism) or may be different. In view of availability of the material, they are preferably the same.

In the case that the composition contains at least two types of the fluorinated compound (B), it is preferred that $CX^3X^4$ in at least one type of the fluorinated compound (B) is the same as $CX^1X^2$ in the fluorinated polymer (A), and it is particularly preferred that $CX^3X^4$ in all types of the fluorinated compound (B) is the same as $CX^1X^2$ in the fluorinated polymer (A).

In the fluorinated polymer (A) and the fluorinated compound (B) contained in the composition, $CY^1$ in fluorinated polymer (A) may be the same as $CY^2$ in the fluorinated compound (B) or different from $CY^2$ in the fluorinated compound (B). In view of availability of the material, they are preferably the same.

In the case that the composition contains at least two types of the fluorinated compound (B), it is preferred that $CY^2$ in at least one type of the fluorinated compound (B) is the same as $CY^1$ in the fluorinated polymer (A), and it is particularly preferred that $CY^2$ in all types of the fluorinated compound (B) is the same as $CY^1$ in the fluorinated polymer (A).

In the fluorinated polymer (A) and the fluorinated compound (B) contained in the composition, $COOM^1$ in fluorinated polymer (A) may be the same as $COOM^2$ in the fluorinated compound (B) or different from $COOM^2$ in the fluorinated compound (B). In view of availability of the material, they are preferably the same.

In the case that the composition contains at least two types of the fluorinated compound (B), it is preferred that $COOM^2$ in at least one type of the fluorinated compound (B) is the same as $COOM^1$ in the fluorinated polymer (A), and it is particularly preferred that $COOM^2$ in all types of the fluorinated compound (B) is the same as $COOM^1$ in the fluorinated polymer (A).

In the fluorinated polymer (A) and the fluorinated compound (B) contained in the composition, $Rf^1$ in the fluorinated polymer (A) may be the same as $Rf^2$ in the fluorinated compound (B) or different from $Rf^2$ in the fluorinated compound (B). In view of availability of the material, they are preferably the same.

In the case that the composition contains at least two types of the fluorinated compound (B), it is preferred that $Rf^2$ in at least one type of the fluorinated compound (B) is the same as $Rf^1$ in the fluorinated polymer (A), and it is particularly preferred that $Rf^2$ in all types of the fluorinated compound (B) is the same as $Rf^1$ in the fluorinated polymer (A).

Particularly in view of the best availability of the material, it is preferred that $CX^1X^2$, $CY^C$, $COOM^1$ and $Rf^1$ in the fluorinated polymer (A) are the same as $CX^3X^4$, $CY^2$, $COOM^2$ and $Rf^2$ in the fluorinated compound (B), respectively.

The content of the fluorinated compound (B) is from 0.1 to 8.0 parts by mass, preferably from 0.15 to 6.0 parts by mass, particularly preferably from 0.15 to 0.5 part by mass, per 100 parts by mass of the fluorinated polymer (A) in the coating composition.

When the content is at least the lower limit value in the above range, the excellent effect to make the antireflection coating layer thin by containing the fluorinated compound (B) is obtained. When it is at most the upper limit value in the above range, the increase of the refractive index by containing the fluorinated compound (B) is sufficiently suppressed.

The content of the fluorinated polymer (A) in the coating composition is not particularly limited. In view of the storage stability, the content of the fluorinated polymer (A) in the coating composition is preferably at most 25 mass %, more preferably at most 22 mass %, particularly preferably at most 18 mass %. In view of the storage cost, the transport cost of the coating composition and obtaining required concentration of the fluorinated polymer (A) in coating process, the content is preferably at least 1 mass %, more preferably at least 5 mass %, further preferably at least 10 mass %, particularly preferably at least 15 mass %.

The coating composition may be produced by the following method (1) or (2).

Method (1): the fluorinated polymer (A) is produced by the above method, and a compound derived from monomer which has not reacted in the polymerization (hereinafter sometimes referred to as "unreacted monomer") is used as the fluorinated compound (B), and no fluorinated compound (B) is added after the production of the fluorinated polymer (A).

The compound derived from the unreacted monomer means a compound having the terminal group of the unreacted monomer converted by the same method as the production of the fluorinated polymer (A).

Specifically, a part of the compound derived from the unreacted monomer is removed to achieve the target content of the fluorinated compound (B) in the composition. The content of the unreacted monomer may be measured by the after-described method about the quantitatively determine of the unreacted monomer.

Method (2): the fluorinated polymer (A) is produced by the above method, and then the fluorinated compound (B) is added. In the production, a part of or the entire compound derived from the unreacted monomer is removed and then the fluorinated compound (B) may be added.

In method (1) or (2), the method of removing the compound derived from the unreacted monomer is preferably a method of heating the polymerization reaction product under reduced pressure after completion of the polymerization reaction of the fluorinated polymer (A). The amount of the unreacted monomer removed can be controlled by the heating time and the degree of pressure reduction.

According to method (1), a coating composition in which $CX^1X^2$, $CY^1$, $COOM^1$ and $Rf^1$ in the fluorinated polymer (A) are the same as $CX^3X^4$, $CY^2$, $COOM^2$ and $Rf^2$ in the fluorinated compound (B) can be obtained.

According to method (2), a fluorinated compound (B) different from the compound derived from the unreacted monomer can be contained in the composition.

[Other Polymer]

The coating composition of the present invention may contain a polymer different from the fluorinated polymer (A) (hereinafter sometimes referred to as "other polymer") within the range not to impair the effects of the present invention.

Polyacrylic acid may be mentioned as other polymer, for example.

The number average molecular weight of other polymer is preferably from 1,000 to 30,000, more preferably from 1,500 to 5,000, particularly preferably from 2,500 to 3,500.

Hereinafter, the total mass of the fluorinated polymer (A) and other polymer will be referred to as the total polymer amount. In the case that no other polymer is contained, the mass of the fluorinated polymer (A) corresponds to the total polymer amount.

In the case that the coating composition of the present invention contains other polymer, the content of other polymer is preferably from 1 to 50 mass %, particularly preferably from 1 to 30 mass % based on the total polymer amount.

[Other Component]

The coating composition of the present invention may contain solvent, surfactant or other additive as required. In the case that the coating composition contains solvent, it is preferred that the fluorinated polymer (A) and the fluorinated compound (B) are dissolved in the solvent.

As the solvent contained in the coating composition of the present invention, water, organic solvent, or mixed solvent of water and organic solvent, may be used. For example the organic solvent may be an alcohol such as methanol, ethanol, isopropanol, 2-butanol, or fluorinated alcohol. As the fluorinated alcohol, fluorinated alcohol mentioned as the organic solvent used for the hydrolysis may be exemplified. In the case that the hydrolysis above mentioned is carried out, the fluorinated alcohol used for the hydrolysis above mentioned may be used as a part or whole of the solvent in the coating composition.

In the coating composition of the present invention, surfactant may be contained as the additive to improve wettability in the application process and to improve uniformity of the coating layer formed. As the surfactant, for example, amine salt of fluorinated organic acid may be mentioned. Specifically, a compound having a polyfluoroalkyl group and a polyoxyethylene group (trade name: Fluorad "FC-430", "FC-4430", etc., manufactured by 3M), acetylene glycol and acetylene glycol added polyoxyethylene (trade name: "Surfynol 104", "Surfynol 420", manufactured by Air Products and Chemicals, Inc.), alkyl sulfonic acid and alkylbenzene sulfonic acid (for example, trade name: Nikkol "SBL-2N-27", etc., manufactured by Nikko Chemicals Co., Ltd.), and a compound containing a hydroxy group and no polyoxyethylene group (such as polyglycerol fatty acid ester), etc. may be mentioned.

If the content of the surfactant in the composition is too high, whitening of the coating layer is likely to be led, and further, it may diffuse in the photoresist layer located in the lower of the antireflection coating layer, therefore it may cause exposure failure. In addition, the more the amount of added surfactant which is not a perfluoro compound increases, the more the refractive index of the antireflection coating layer tends to increase. Accordingly, in the case that the surfactant is added, its content is preferably at most 10 mass %, particularly preferably at most 5 mass %, compared with the total polymer amount.

As additives which may be contained in the coating composition of the present invention, other than solvent and surfactant, additives known for the coating composition for forming antireflection coating layer may be mentioned.

As specific examples, photoacid generators such as onium salts, haloalkyl group-containing compounds, o-quinonediazide compounds, nitrobenzyl compounds, sulfonic acid ester compounds and sulfone compounds may be mentioned.

The more the amount of the added additive which is not perfluoro compound increases, the more the refractive index of the antireflection coating layer tends to increase. Accordingly, in the case that the coating composition contains additives other than solvent and surfactant, the total content is preferably at most 10 mass %, particularly preferably at most 5 mass % based on the total polymer amount.

[Coating Liquid]

The coating composition of the present invention is used for a coating liquid. The coating liquid is a liquid to be applied to an object to be coated.

The coating composition at least contains the fluorinated polymer (A) and the fluorinated compound (B). All the optional components other than them may be contained in the coating composition, and then the coating composition may be used as the coating liquid as it is.

Otherwise, a part or all of the optional components may not be contained in the coating composition and be added when the coating liquid is prepared. In addition, a part of the optional components may be contained in the coating composition, and then, the rest may be added when the coating liquid is prepared.

The total polymer amount in the coating liquid is preferably at most 10 mass % in view of excellent coating property, more preferably at most 7 mass %, particularly preferably at most 5 mass %. In view about forming an antireflection coating layer having required coating layer thickness, it is preferably at least 1 mass %, more preferably at least 2 mass %, particularly preferably at least 4 mass %.

[Process for Producing Photoresist Laminate]

In the present invention, a photoresist laminate is a laminate comprising a photoresist layer and an antireflection coating layer provided on the surface of the photoresist layer.

In the process for producing the photoresist laminate of the present invention, a coating liquid containing the coating composition of the present invention is applied to the surface of a photoresist layer and dried to form an antireflection coating layer.

Known methods may be used as the method of applying the coating liquid to the surface of the photoresist layer. Spin coating method is preferred in view of uniformity of the antireflection coating layer and simplicity.

By drying (that is, removing the solvent) after coating, an antireflection coating layer is obtained. As a method for removing the solvent, for example, it is preferred to conduct heating and drying by using a hot plate or an oven. As the drying conditions, for example, in the case of using a hot plate, the condition that drying temperature is from 80 to 150° C. and drying time is from 5 to 30 minutes is preferred.

The thickness of the antireflection coating layer may be set in accordance with the known antireflection theory, and it is preferred to adjust the coating layer thickness to be odd number of multiple of "(exposure wavelength)/(4×(refractive index of the antireflection coating layer))", because the antireflection performance will be high.

The present invention is useful for a method of forming resist patterns, which comprises forming the photoresist layer on the substrate, forming the antireflection coating layer on its surface to obtain the photoresist laminate, exposing the photoresist laminate, and then, conducting development by using aqueous alkaline solution to form the resist patterns.

Namely, by forming the antireflection coating layer by using the coating composition of the present invention, the standing wave effect is suppressed, and it is possible to suppress dimensional change or deformation of the shape of the resist pattern. And, the antireflection coating layer has good solubility in the aqueous alkaline solution, and it is possible to conduct the development and removal of the antireflection coating layer at the same time.

Further, in the case that the resist layer is a layer made of chemical amplification type resist, what we call, which utilizes the catalytic action of protons formed by the exposure, the resist layer is susceptible to deterioration of the resist surface when it is left in the atmospheric air after the exposure. When the coating layer is formed by using the coating composition of the present invention on the surface of such a resist layer, it functions as a protective layer, and it is possible to prevent the deterioration of the resist layer surface.

[Function and Mechanism]

According to the present invention, as shown in the after-described Examples, by incorporating the fluorinated compound (B) in the coating composition, the antireflection coating layer can be made thin without increasing its refractive index.

The reason why such an effect is obtained is not clearly understood, but it is considered as follows. The high fluorine atom content of the fluorinated compound (B) contributes to suppression of increase of the refractive index, and the fluorinated polymer (A) is highly compatible with the fluorinated compound (B), since the unit (1) in the fluorinated polymer (A) is similar to the molecular structure of the fluorinated compound (B), and —COOM$^2$ in the fluorinated compound (B) is hydrophilic, whereby the fluorinated compound (B) functions as surfactant. Finally, these respects contribute to the reduction in the thickness of the coating layer.

EXAMPLES

Now, the present invention will be described in further detail with the references to Examples. However, it should be understood that the present invention is by no means restricted to such specific Examples. Ex. 3 to 5 are Examples of the present invention, Ex. 1, 2 and 6 are Comparative Examples, and Ex. 7 is a Reference Example.

As the measurement method and the evaluation method, the following methods were utilized.

[Number Average Molecular Weight]

The value of the number average molecular weight of the polymer is molecular weight calculated based on the molecular weight of polystyrene (PS) measured by gel permeation chromatography (GPC).

[Refractive Index and Coating Layer Thickness of Coating Layer]

The coating liquid was applied by spin coating (3,000 revolutions per minute, 180 seconds) on a silicon wafer and dried for 5 minutes on a hot plate adjusted to 150° C. to form a coating layer (antireflection coating layer). The refractive index at 193 nm wavelength and the coating layer thickness of the coating layer were measured by an ellipsometer. The amount of the used coating liquid was constant at 2 mL.

Here, even with the constant amount of the coating liquid used under the constant coating conditions, the coating layer thickness varies depending upon the properties of the coating liquid.

[Method of Quantitatively Determining Unreacted Monomer]

A 3 mass % solution (solvent: $CF_3CH_2OCF_2CF_2H$) of the polymer precursor was prepared, and the solution was analyzed by gas chromatography.

Apparatus: gas chromatography apparatus (6850 series manufactured by Agilent Technologies)

Column: DB-1301 column (manufactured by Agilent Technologies)

[Compounds Used]

(Monomer)

Monomer (1-1): $CF_2$=$CFOCF_2CF_2CF_2COOCH_3$ (molecular weight: 306)

(Fluorinated Compound (B))

Fluorinated compound (B-1): $CF_2$=$CFOCF_2CF_2CF_2COOH$ (molecular weight: 292)

(Polymerization Initiator)

Initiator solution (A): diisopropylperoxydicarbonate solution (concentration: 50 mass %, solvent: $CF_3CH_2OCF_2CF_2H$)

Ex. 1

Fluorinated Polymer (A-2) and Solution (2)

50 g of monomer (1-1) and 0.60 g of initiator solution (A) were prepared in a reactor, and the inside of the reactor was replaced by nitrogen. A polymerization reaction was carried out for 72 hours with stirring and heating to adjust the inner temperature to 40° C. After completion of the polymerization reaction, unreacted raw material was distilled by drying in vacuum at 80° C. to obtain 21.5 g of polymer precursor (A-1). The number average molecular weight of polymer precursor (A-1) was 3,300.

The amount of monomer (1-1) remaining in polymer precursor (A-1) was measured by the above method of quantitatively determining unreacted monomer, whereupon it was less than the detection limit (1 ppm).

Then, the methyl groups at the terminals of the side chains in polymer precursor (A-1) were hydrolyzed and converted to hydroxy groups. Namely, polymer precursor (A-1) and water were stirred at 80° C. for 12 hours to carry out hydrolysis to obtain a 18 mass % aqueous solution (solution (1)) of fluorinated polymer (A-2) in a separable flask.

Further, in order to increase the accuracy of the refractive index measurement, the solvent was replaced by 2-butanol. Namely, the solution (1) was dried in vacuum at 80° C. to distill water off, and only fluorinated polymer (A-2) was educed. A required amount of the obtained fluorinated polymer (A-2) was put in a vial, and 2-butanol was added to prepare a coating composition (solution (2)) which concentration of the fluorinated polymer (A) is 2.0 mass %.

The coating layer thickness and the refractive index of the coating layer prepared by using the obtained solution (2) as the coating liquid were evaluated by the above method. The evaluation results are shown in Table 1.

Ex. 2 to 6

Fluorinated compound (B-1) was added to solution (2) obtained in Ex. 1 to adjust the amount, per 100 parts by mass of the fluorinated polymer (A) in the solution, of the fluorinated compound (B) equal to the value in Table 1. By the above mentioned operation, the coating composition comprising the fluorinated polymer (A), fluorinated compound (B) and solvent was prepared.

The evaluations of the obtained coating composition were conducted in the same manner as in Ex. 1. The evaluation results are shown in Table 1.

Ex. 7

In Ex. 5, fluorinated surfactant (Surflon S211 (tradename), manufactured by AGC Seimi Chemical Co., Ltd.), instead of fluorinated compound (B-1), was added to the solution (2). By using the obtained solution as the coating composition, the same evaluations as in Ex. 1 were conducted. The evaluation results are shown in Table 1.

TABLE 1

| | Fluorinated polymer (A) [parts by mass] | Fluorinated compound (B) [parts by mass] | Fluorinated surfactant [parts by mass] | Coating layer thickness [nm] | refractive index [193 nm] |
|---|---|---|---|---|---|
| Ex. 1 | 100 | — | — | 55 | 1.46 |
| Ex. 2 | | 0.05 | — | 53 | 1.46 |
| Ex. 3 | | 0.15 | — | 38 | 1.46 |
| Ex. 4 | | 0.5 | — | 35 | 1.46 |
| Ex. 5 | | 6.0 | — | 31 | 1.46 |
| Ex. 6 | | 8.5 | — | 30 | 1.48 |
| Ex. 7 | | — | 6.0 | 29 | 1.49 |

As shown from the results in Table 1, in Ex. 3 to 5, in which the fluorinated compound (B) was contained in the amount of from 0.1 to 8.0 parts by mass per 100 parts by mass of the fluorinated polymer (A) in the coating composition, the coating layer thickness became thin under the same coating conditions, and the refractive index of the formed antireflection coating layer was the same as compared with Ex. 1 in which the fluorinated compound (B) was not contained.

Ex. 7 is a Reference Example in which fluorinated surfactant was added for the purpose of making the coating layer thin. As compared with Ex. 1, the formed antireflection coating layer became thin under the same coating conditions, however, the refractive index of the coating layer became high.

The entire disclosure of Japanese Patent Application No. 2016-086162 filed on Apr. 22, 2016 including specification, claims and summary is incorporated herein by reference in its entirety.

What is claimed is:

1. A coating composition, comprising:
    a fluorinated polymer having a unit represented by formula (1); and
    a fluorinated compound represented by formula (2), wherein the content of the fluorinated compound is from 0.1 to 8.0 parts by mass per 100 parts by mass of the fluorinated polymer, and the fluorinated polymer has number average molecular weight of from 1,000 to 30,000:

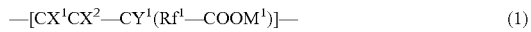 (1)

wherein $X^1$ and $X^2$ are each independently a hydrogen atom, a fluorine atom or a chlorine atom, $Y^1$ is a hydrogen atom, a fluorine atom, a chlorine atom, a methyl group or a trifluoromethyl group, $Rf^1$ is a perfluoroalkylene group which may contain an etheric oxygen atom between carbon-carbon atoms, or an oxyperfluoroalkylene group which may contain an etheric oxygen atom between carbon-carbon atoms, the number of carbon atoms in $Rf^1$ is from 1 to 10 or in the case that $Rf^1$ contains the etheric oxygen atom, from 2 to 10, and —COOM$^1$ is —COOH or —COOZ$^1$, wherein $Z^1$ is an ammonium ion in which the hydrogen atom may be substituted;

 (2)

wherein $X^3$ and $X^4$ are each independently a hydrogen atom, a fluorine atom or a chlorine atom, $Y^2$ is a hydrogen atom, a fluorine atom, a chlorine atom, a methyl group or a trifluoromethyl group, $Rf^2$ is a perfluoroalkylene group which may contain an etheric oxygen atom between carbon-carbon atoms, or an oxyperfluoroalkylene group which may contain an etheric oxygen atom between carbon-carbon atoms, the number of carbon atoms in $Rf^2$ is from 1 to 10 or in the case that $Rf^2$ contains the etheric oxygen atom, from 2 to 10, and —COOM$^2$ is —COOH or —COOZ$^2$, wherein $Z^2$ is an ammonium ion in which the hydrogen atom may be substituted.

2. The coating composition according to claim 1, wherein all of $X^1$, $X^2$ and $Y^1$ are fluorine atoms.

3. The coating composition according to claim 1, wherein the content of the fluorinated polymer in the coating composition is from 1 to 25 mass %.

4. The coating composition according to claim 1, wherein $CX^1X^2$ in the fluorinated polymer is equal to $CX^3X^4$ in the fluorinated compound.

5. The coating composition according to claim 1, wherein $CY^1$ in the fluorinated polymer is equal to $CY^2$ in the fluorinated compound.

6. The coating composition according to claim 1, wherein COOM$^1$ in the fluorinated polymer is equal to COOM$^2$ in the fluorinated compound.

7. The coating composition according to claim 1, wherein $Rf^1$ in the fluorinated polymer is equal to $Rf^2$ in the fluorinated compound.

8. The coating composition according to claim 1, further comprising an additional polymer different from the fluorinated polymer, and wherein the content of the additional polymer in the coating composition is from 1 to 50 mass % based on the total amount of the fluorinated polymer and the additional polymer.

9. A process for producing a photoresist laminate having an antireflection coating layer provided on the surface of a photoresist layer, comprising:
    applying a coating liquid which comprises the coating composition as defined in claim 8 and in which the total content of the fluorinated polymer and the additional polymer is from 1 to 10 mass %, to the surface of the photoresist layer; and
    drying the coating liquid to form the antireflection coating layer.

10. The coating composition according to claim 1, further comprising a solvent.

11. A process for producing a photoresist laminate having an antireflection coating layer provided on the surface of a photoresist layer, comprising:
    applying a coating liquid which comprises the coating composition as defined in claim 1 and in which the content of the fluorinated polymer is from 1 to 10 mass %, to the surface of the photoresist layer; and
    drying the coating liquid to form the antireflection coating layer.

* * * * *